(12) United States Patent
Yutaka et al.

(10) Patent No.: US 11,128,381 B2
(45) Date of Patent: Sep. 21, 2021

(54) PHOTON DETECTION LIGHT RECEIVING DEVICE AND OPTICAL WIRELESS COMMUNICATION APPARATUS USING SAME

(71) Applicant: QUANTUM DRIVE CO., LTD., Naha (JP)

(72) Inventors: Koichiro Yutaka, Okinawa (JP); Kaoru Tomishima, Okinawa (JP); Yoshinori Namihira, Okinawa (JP); Yo Maeda, Okinawa (JP); Kazushi Miyagi, Okinawa (JP)

(73) Assignee: QUANTUM DRIVE CO., LTD.

( * ) Notice: Subject to any disclaimer, the term of this patent is extended or adjusted under 35 U.S.C. 154(b) by 0 days.

(21) Appl. No.: 17/059,102

(22) PCT Filed: Oct. 17, 2018

(86) PCT No.: PCT/JP2018/038750
§ 371 (c)(1),
(2) Date: Nov. 25, 2020

(87) PCT Pub. No.: WO2019/230015
PCT Pub. Date: Dec. 5, 2019

(65) Prior Publication Data
US 2021/0226706 A1 Jul. 22, 2021

(30) Foreign Application Priority Data
May 31, 2018 (JP) .............................. JP2018-105165

(51) Int. Cl.
*H01L 31/107* (2006.01)
*H04B 10/40* (2013.01)
(Continued)

(52) U.S. Cl.
CPC ................ *H04B 10/40* (2013.01); *G01J 1/44* (2013.01); *H01L 31/0203* (2013.01);
(Continued)

(58) Field of Classification Search
CPC ......... H01L 31/02027; H01L 31/02164; H01L 31/107; H04B 10/1149; H04J 14/0284; G01T 1/248
(Continued)

(56) References Cited

U.S. PATENT DOCUMENTS

2006/0175529 A1* 8/2006 Harmon .......... H01L 31/035236
250/207
2014/0110810 A1 4/2014 Yamamoto et al.
(Continued)

FOREIGN PATENT DOCUMENTS

JP H0521831 A 1/1993
JP 2001177118 A 6/2001
(Continued)

OTHER PUBLICATIONS

International Search Report for PCT/JP2018/038750 dated Jan. 22, 2019; 3 pages.
(Continued)

*Primary Examiner* — Que Tan Le
(74) *Attorney, Agent, or Firm* — Lerner, David, Littenberg, Krumholz & Mentlik, LLP

(57) ABSTRACT

Provided are: a photon detection light-receiving device with which it is possible to avoid malfunctions caused by the application of high voltages, and to shorten the delays in communication time in mesh-type network communication; and a communication apparatus equipped with the photon detection light-receiving device. The photon detection light-receiving device has a photon detection APD, a quenching resistor and a capacitor, with one end of the quenching
(Continued)

resistor and one end of the capacitor being connected to one terminal of the photon detection APD. The optical wireless communication apparatus comprises: a housing; a photon detection light-receiving device that generates an electrical signal from received light; a receiving unit that generates a reception data signal using an electrical signal from the photon detection light-receiving device; a transmission unit that generates an electrical signal using a transmission data signal; a light emitting device into which the electrical signal from the transmission unit is input and generates transmission light; and an optical wireless communication controller that generates transmission data or reception data corresponding to the protocol of an external apparatus.

7 Claims, 11 Drawing Sheets

(51) Int. Cl.
H01L 31/02 (2006.01)
H01L 31/0203 (2014.01)
H01L 31/0232 (2014.01)
H01L 31/173 (2006.01)
G01J 1/44 (2006.01)

(52) U.S. Cl.
CPC .. *H01L 31/02027* (2013.01); *H01L 31/02327* (2013.01); *H01L 31/107* (2013.01); *H01L 31/173* (2013.01); *G01J 2001/442* (2013.01); *G01J 2001/4466* (2013.01)

(58) Field of Classification Search
USPC .......................................... 250/214 R, 214.1
See application file for complete search history.

(56) References Cited

U.S. PATENT DOCUMENTS

2015/0296161 A1  10/2015  Saito et al.
2020/0259038 A1   8/2020  Natsuaki et al.

FOREIGN PATENT DOCUMENTS

| JP | 2012089593 A | 5/2012 |
| JP | 2014082420 A | 5/2014 |
| JP | 2015204498 A | 11/2015 |
| JP | 2017041782 A | 2/2017 |
| WO | 2017004663 A1 | 1/2017 |
| WO | 2017094277 A1 | 6/2017 |

OTHER PUBLICATIONS

International Preliminary Report on Patentability for Application No. PCT/JP2018/038750, dated Dec. 1, 2020, 8 pages.

* cited by examiner

PHOTON DETECTION LIGHT RECEIVING DEVICE AND OPTICAL WIRELESS COMMUNICATION APPARATUS USING SAME

CROSS-REFERENCE TO RELATED APPLICATIONS

The present application is a national phase entry under 35 U.S.C. § 371 of International Application No. PCT/JP2018/038750, filed on Oct. 17, 2018, which claims priority from Japanese Patent Application No. 2018-105165, filed on May 31, 2018, the disclosures of all of which are incorporated herein by reference.

TECHNICAL FIELD

The present invention relates to a photon detection light receiving device and an optical wireless communication apparatus using the same, and more particularly to a photon detection light receiving device suitable for mesh-type network communication and an optical wireless communication apparatus using the same.

BACKGROUND ART

In recent years, an avalanche photodiode (APD) utilizing avalanche yield (avalanche breakdown) is widely used as a high-sensitivity light receiving device. The avalanche breakdown is a phenomenon in which a large current flows by an acceleration of free electrons in an electric field to repeatedly cause collision ionization one after another. Japanese Patent Laid-Open No. 2017-41782 describes an example of a light receiving apparatus using a light receiving device in which a plurality of APDs are disposed in an array and a visible light communication system.

As for the operation mode of the APD, there are a linear mode in which it is operated with a reverse bias voltage lower than a yield voltage (breakdown voltage) and a Geiger mode in which it is operated with a reverse bias voltage higher than the breakdown voltage. In the linear mode, the output current is substantially proportional to the incident light intensity, and is used for measuring the incident light intensity. The rate of electron-hole pair disappearance is larger than the rate of electron-hole pair generation, and the avalanche is spontaneously stopped. In the Geiger mode, avalanche breakdown can be caused even with the incidence of a single-photon (one photon). Therefore, those operating in the Geiger mode are also called a single-photon avalanche diode (SPAD).

In SPAD, a single-photon (one photon) is observed as a separated digital amount one by one. In this way, a technique for measuring a single-photon one by one is called "photon counting" or "photon counting method". The SPAD can respond to an optical event with a high time resolution of about several tens of picoseconds. Therefore, it is suitable for time measurements for weak optical signals, such as time-of-flight (TOF).

RELATED ART DOCUMENTS

Patent Documents

Patent Document 1: Japanese Patent Laid-Open No. 2015-204498 (Toshiba Corporation)
Patent Document 2: Japanese Patent Laid-Open No. 2017-41782 (Lampserve Inc.)
Patent Document 3: Japanese Patent Laid-Open No. 2014-82420 (HAMAMATSU PHOTONICS K.K.)
Patent Document 4: WO 2017/094277 (Sharp Corporation)

SUMMARY OF THE INVENTION

Problems to be Solved by the Invention

In a conventional single-photon avalanche diode (SPAD), since it is operated in a Geiger mode, a reverse bias voltage higher than a breakdown voltage is applied. Therefore, the minute leak current generated by high voltage application is also amplified and measured as noise. Therefore, in conventional SPAD, it is necessary to remove noise due to high-voltage application.

In a conventional single-photon avalanche diode (SPAD), avalanche breakdown does not occur for the next single-photon before the output current becomes zero. This is called pulse insensitive time (pulse dead time) or recovery time. In the dead time of the SPAD, the avalanche amplification function is not obtained. The dead time is about several hundred nanoseconds. Therefore, when a SPAD is used for a communication apparatus, a delay of time corresponding to the dead time is generated. For example, in mesh type network communication, "N" pieces of communication apparatuses are relayed to transmit data. Therefore, when the delay in each communication apparatus is time "T", the delay time "T×N" is generated through the "N" pieces of relayed communication apparatuses.

The purpose of the present invention is to provide a photon detection light receiving device capable of avoiding a failure caused by the high-voltage application and shortening a delay of communication time in mesh-type network communication, and an optical wireless communication apparatus using the photon detection light receiving device.

Means for Solving the Problems

According to an embodiment of the present invention, there is provided a photon detection light receiving device comprising:
a photon detection avalanche photodiode (APD), a quenching resistor and a capacitor,
wherein an end of the quenching resistor and an end of the capacitor are connected to one of terminals of the photon detection APD, and the photon detection APD is operated in a linear mode in which a reverse bias voltage lower than a breakdown voltage is applied.

According to an embodiment of the present invention, the photon detection light receiving device may be configured such that: the reverse bias voltage is 10-70 V, a resistance value "R" of the quenching resistor is 10-1000Ω, and a capacitance "C" of the capacitor is 0.1-5 pF.

According to an embodiment of the present invention, the photon detection light receiving device may be configured such that: when a peak of a wavelength of a received light of the photon detection APD is 405-470 nm, a peak voltage of a single-photon avalanche voltage waveform of the photon detection APD is 0.1-0.5 V, and a dead time of the photon detection APD is 500 ps to 5 ns.

According to an embodiment of the present invention, there is provided a photon detection light receiving device array comprising: a plurality of photon detection light receiving devices connected in an array,
wherein each of the photon detection light receiving devices has a photon detection APD, a quenching resistor and a capacitor, an end of the quenching resistor and an end of the capacitor being connected to one of terminals of the photon detection APD, and the photon detection APD is operated in a linear mode in which a reverse bias voltage lower than a breakdown voltage is applied.

According to an embodiment of the present invention, the photon detection light receiving device array may be configured such that:
the reverse bias voltage is 10-70 V, a resistance value "R" of the quenching resistor is 10-1000Ω, and a capacitance "C" of the capacitor is 0.1-5 pF, and
when a peak of a wavelength of the received light of the photon detection APD is 405-470 nm, a peak voltage of a single-photon avalanche voltage waveform of the photon detection APD is 0.1-0.5 V, and a dead time of the photon detection APD is 500 ps to 5 ns.

According to an embodiment of the present invention, there is provided an optical wireless communication apparatus comprising:
a housing, a photon detection light receiving device that generates an electric signal from a received light, a reception portion that generates a reception data signal from an electric signal from the photon detection light receiving device, a transmission portion that generates an electric signal from a transmission data signal, a light emitting device that receives an electric signal from the transmission portion and generates transmission light, and an optical wireless communication controller that generates reception data or transmission data corresponding to a protocol of an external apparatus,
wherein the photon detection light receiving device has a photon detection APD, a quenching resistor and a capacitor, an end of the quenching resistor and an end of the capacitor being connected to one of terminals of the photon detection APD, and the photon detection APD is operated in a linear mode in which a reverse bias voltage lower than a breakdown voltage is applied.

According to an embodiment of the present invention, the optical wireless communication apparatus may be configured such that:
the reverse bias voltage is 10-70 V, a resistance value "R" of the quenching resistor is 10-1000Ω, and a capacitance "C" of the capacitor is 0.1-5 pF,
when a peak of a wavelength of the received light of the photon detection APD is 405-470 nm, a peak voltage of a single-photon avalanche voltage waveform of the photon detection APD is 0.1-0.5 V, and a dead time of the photon detection APD is 500 ps to 5 ns.

According to an embodiment of the present invention, the optical wireless communication apparatus may be configured such that:
the housing has a plurality of surfaces, and the photon detection light receiving device and the light emitting device are disposed on each of the plurality of surfaces.

According to an embodiment of the present invention, the optical wireless communication apparatus may be configured such that:
the housing has three surfaces, and the photon detection light receiving device and the light emitting device are disposed on each of the three surfaces.

According to an embodiment of the present invention, the optical wireless communication apparatus may be configured such that:
the photon detection light receiving device and the light emitting device are covered with a light diffusion medium, and the light diffusion medium includes a transparent base material and particulate light diffusion particles dispersed in the base material.

Effect of the Invention

According to embodiments of the present invention, it is possible to provide a photon detection light receiving device capable of avoiding a failure caused by the high-voltage application and shortening a delay of communication time in mesh-type network communication, and an optical wireless communication apparatus using the same.

EMBODIMENTS OF THE PRESENT INVENTION

Figure 1A:
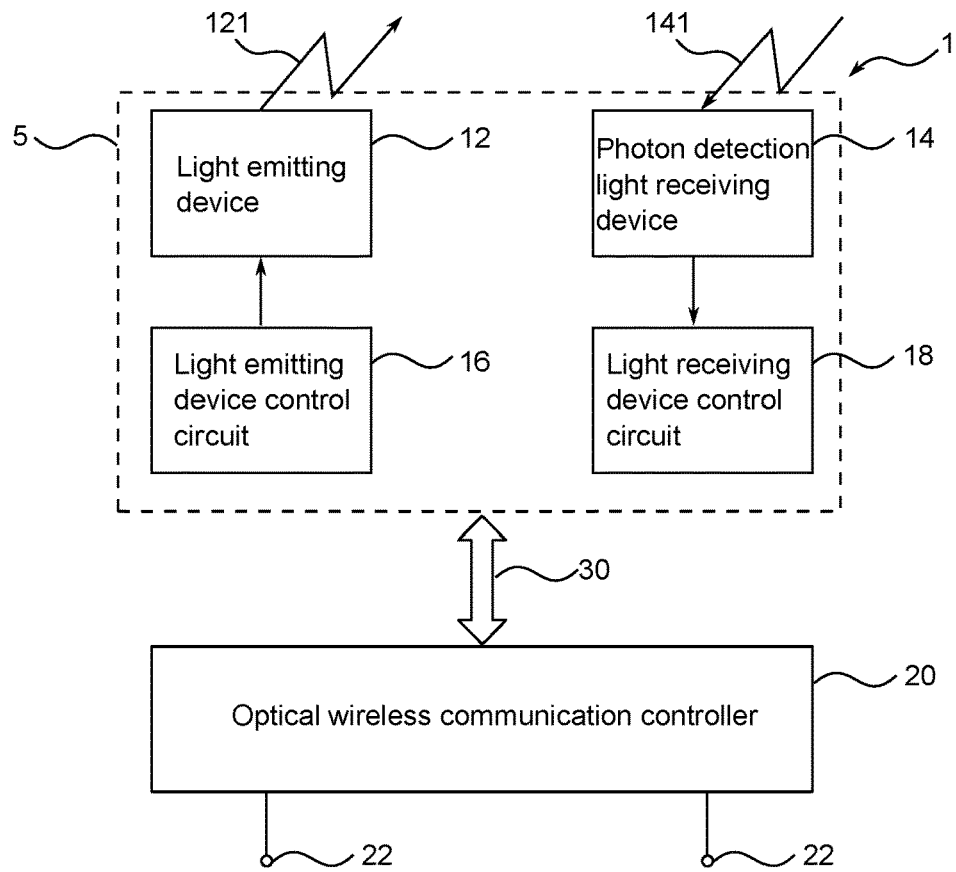
FIG. 1A is a diagram illustrating an example of a configuration of an optical wireless communication apparatus according to an embodiment of the present invention.

Embodiments of the present invention will be described in detail with reference to the accompanying drawings. In the drawings, the same reference numerals are given to the same devices, respectively, and the overlapped explanation is omitted.

Referring to FIG. 1A, a configuration example of an optical wireless communication apparatus according to an embodiment of the present invention will be described. The optical wireless communication apparatus 1 according to this example has a light receiving/emitting portion 5 and an optical wireless communication controller 20. The light receiving/emitting portion 5 and the optical wireless communication controller 20 are connected with each other by an optical wireless communication connection portion 30. The light receiving/emitting portion 5 and the optical wireless communication controller 20 may be integrally constituted, but may be disposed remotely from each other. For example, the light receiving/emitting portion 5 may be disposed at a high position such as an electric pole, and the optical wireless communication controller 20 may be disposed on the ground. The light receiving/emitting portion 5 has a light emitting device 12, a photon detection light receiving device 14, a light emitting device control circuit 16, and a light receiving device control circuit 18.

The transmission light 121 and the received light 141 may be one of near ultraviolet light (wavelength: 280-400 nm), visible light (wavelength: 360-830 nm), and infrared light (wavelength: 0.7-1000 μm). According to this embodiment, the transmission light 121 and the received light 141 are preferably visible light (wavelength: 360-830 nm), and more preferably blue to purple color (wavelength: 405-470 nm).

The light emitting device 12 may be a point light source or a surface light source. The light emitting device 12 may include a high luminance discharge lamp, but may include an LED (Light Emitting Diode) or an organic EL (Electro Luminescence). The light emitting device 12 may include an LD (Laser Diode) having a light diffusion medium. The light emitting device 12 preferably includes a light source emitting visible light, for example, a blue LED or a blue LD The photon detection light receiving device 14 may include a photodiode (PD), an avalanche photodiode (APD), an APD array, an MPPC (Multi-Pixel Photon Counter) (registered trademark), or the like. According to an embodiment of the present invention, the photon detection light receiving device 14 may be any APD that causes a single-photon avalanche breakdown, and preferably includes a photon detection APD or a photon detection APD array according to an embodiment of the present invention shown in FIGS. 3A and 3B. These will be described in detail later.

The optical wireless communication controller 20 can be connected to various terminal apparatus via an interface portion 22. The terminal apparatus may be an Ethernet (registered trademark) apparatus, a USB (Universal Serial Bus) apparatus, an HDMI (High-Definition Multimedia Interface) (registered trademark) apparatus, or the like. The optical wireless communication controller 20 converts or generates a signal in accordance with the protocol of various terminal apparatus connected to the interface portion 22.

The optical wireless communication apparatus 1 according to this example has a transmission function for transmitting data via a network, a reception function for receiving data via the network, and a relay function for relaying data via the network.

First, the transmission function of the optical wireless communication apparatus of the present example will be described. The optical wireless communication controller 20 generates a transmission data signal corresponding to the protocol of the apparatus connected via the interface portion 22, converts the transmission data signal into an electric signal, and provides it to the light emitting device control circuit 16. The light emitting device control circuit 16 provides the electric signal to the light emitting device 12. The light emitting device 12 generates transmission light 121 including transmission data.

Next, the reception function of the optical wireless communication apparatus of the present example will be described. The photon detection light receiving device 14 generates an electric signal from the received light 141 and provides the electric signal to the light receiving device control circuit 18. The light receiving device control circuit 18 provides the electric signal to the optical wireless communication controller 20. The optical wireless communication controller 20 generates reception data corresponding to the protocol of the apparatus connected to the interface portion 22. The received data is provided to a terminal apparatus connected to the interface portion 22.

Finally, the relay function of the optical wireless communication apparatus of the present example will be described. The photon detection light receiving device 14 receives the received light 141, generates an electric signal, and provides the electric signal to the optical wireless communication controller 20 via the light receiving device control circuit 18. The optical wireless communication controller 20 generates a transmission data signal from the received data signal, and provides the transmission data signal to the light emitting device control circuit 16. The light emitting device control circuit 16 generates an electric signal from the transmission data signal and provides the electric signal to the light emitting device 12. The light emitting device 12 generates transmission light 121 including transmission data.

Figure 1B:
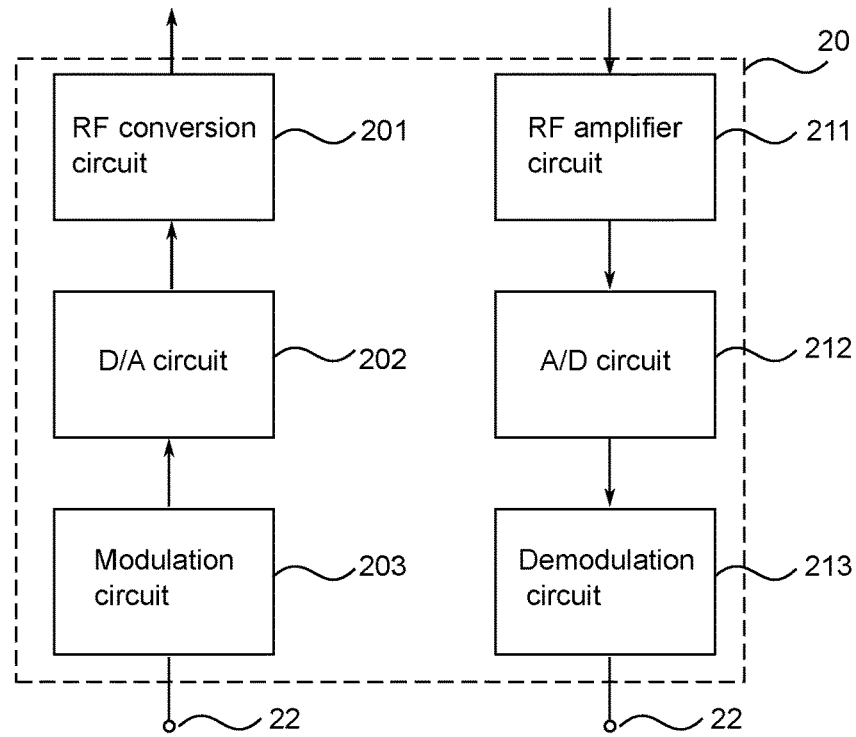
FIG. 1B is a diagram illustrating an example of a configuration of an optical wireless communication controller of an optical wireless communication apparatus according to an embodiment of the present invention.

Referring to FIG. 1B, an example of a configuration of an optical wireless communication controller 20 of an optical wireless communication apparatus according to an embodiment of the present invention will be described. The optical wireless communication controller 20 comprises an RF conversion circuit 201, a D/A circuit 202 and a modulation circuit 203. The modulation circuit 203 converts the transmission data provided via the optical wireless communication controller 20 into a predetermined modulation signal. In this example, any modulation system may be used, for example, OFDM (Orthogonal Frequency Division Multiplexing) or QAM (Quadrature Amplitude Modulation) modulation. The D/A converter circuit 202 converts the digital signal into an analog signal. The RF (Radio Frequency) conversion circuit 201 generates an RF signal, that is, a high frequency signal in which a signal wave is superimposed on a carrier wave.

The optical wireless communication controller 20 further comprises an RF amplifier circuit 211, an A/D circuit 212 and a demodulation circuit 213. The RF amplifier circuit 211 amplifies the received data signal and converts it into an RF (Radio Frequency) signal. The A/D circuit 212 converts an analog signal into a digital signal. The demodulation circuit 213 demodulates the modulation signal to generate reception data.

Figure 2A:
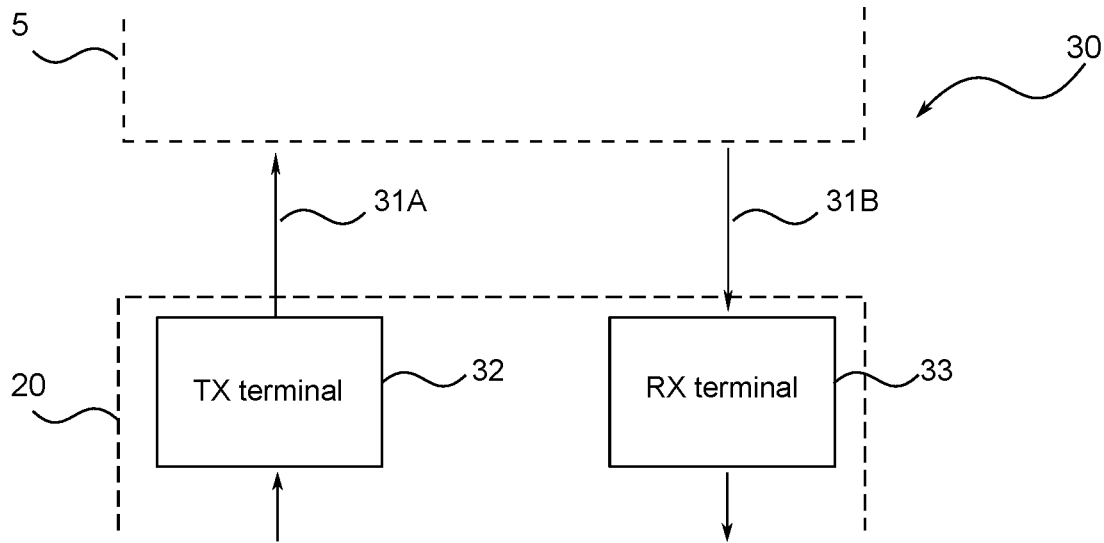
FIG. 2A is a diagram illustrating an example of an optical wireless communication connection portion of an optical wireless communication apparatus according to an embodiment of the present invention.

Referring to FIG. 2A, an example of a configuration of an optical wireless communication connection portion 30 of an optical wireless communication apparatus according to an embodiment of the present invention will be described. The optical wireless communication connection portion 30 according to this example has a TX terminal 32 and an RX terminal 33 provided in the optical wireless communication controller 20. In particular, in the high-frequency circuit, if impedance matching (consistency) is not performed between the output impedance of the transmission-side circuit and the input impedance of the receiving-side circuit, reflection occurs at the connection portion, so that loss becomes large and efficiency is reduced. In an embodiment of the present invention, the TX terminal 32 and the RX terminal 33 are provided with a terminal of an SMA-IPEX standard, respectively. Coaxial cables 31A, 31B having a characteristic impedance of 50Ω for impedance matching are connected to the terminals.

Figure 2B:
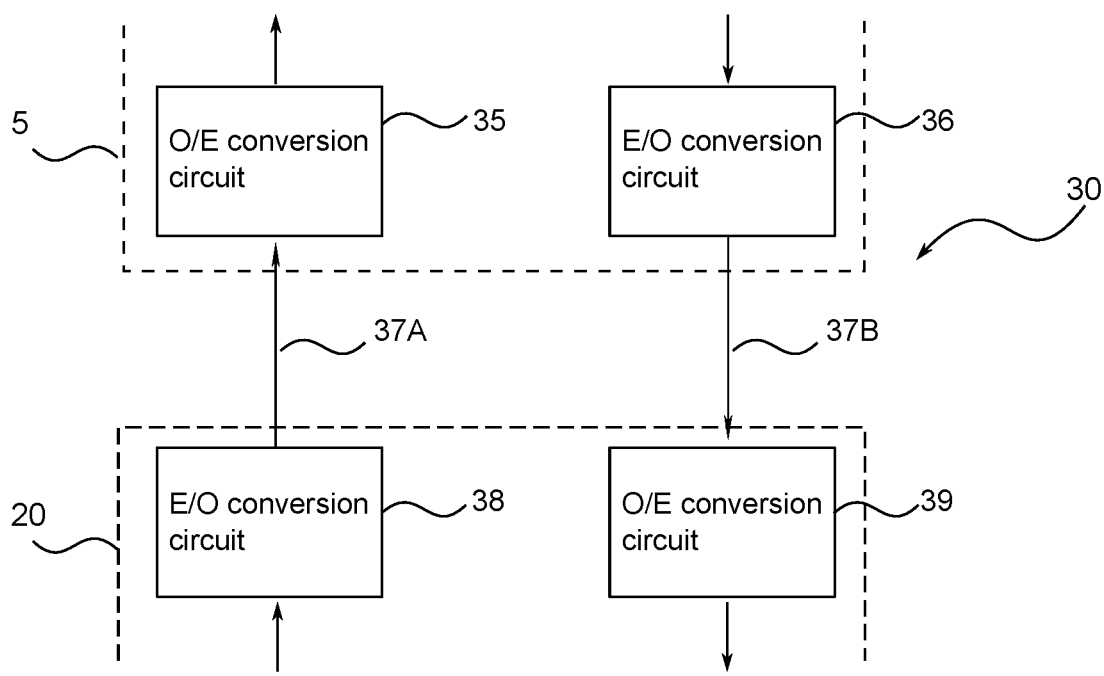
FIG. 2B is a diagram illustrating another example of an optical wireless communication connection portion of an optical wireless communication apparatus according to an embodiment of the present invention.

Referring to FIG. 2B, another example of the configuration of an optical wireless communication connection portion 30 (FIG. 1A) of an optical wireless communication apparatus according to an embodiment of the present invention will be described. An optical wireless communication connection portion 30 according to the present embodiment has an O/E conversion circuit 35 and an E/O conversion circuit 36 provided in light receiving/emitting portion 5 and an E/O conversion circuit 38 and an O/E conversion circuit 39 provided in optical wireless communication controller 20. The O/E conversion circuit 35 and the E/O conversion circuit 36 in light receiving/emitting portion 5 and the E/O conversion circuit 38 and the O/E conversion circuit 39 in optical wireless communication controller 20 (FIG. 1B) are connected respectively via optical fiber cables 37A and 37B. The O/E conversion circuits 35 and 39 convert an optical signal into an electric signal, and the E/O conversion circuits 36 and 38 convert an electric signal into an optical signal.

Figure 3A:
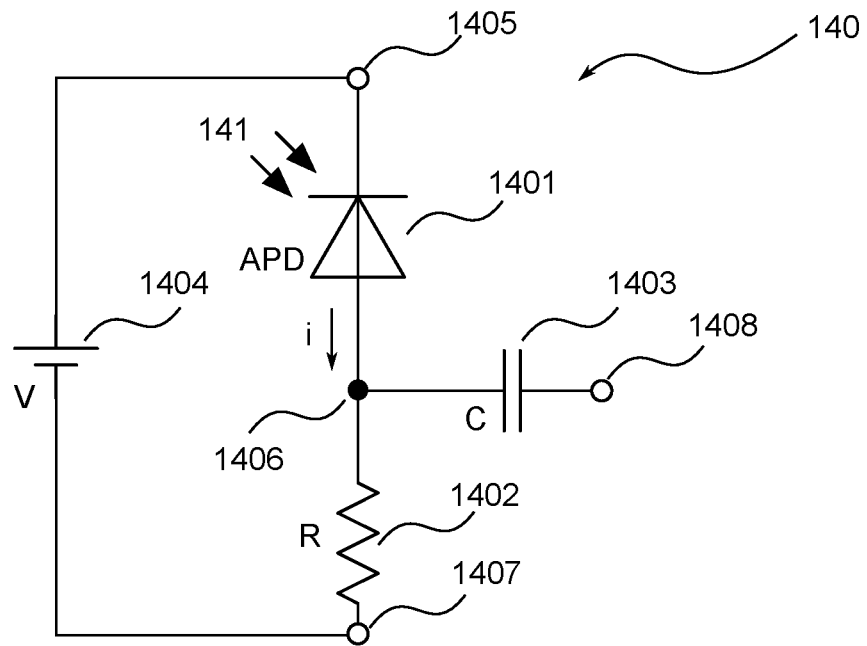
FIG. 3A is a diagram showing a first example of a photon detection light receiving device of an optical wireless communication apparatus according to an embodiment of the present invention.

Referring to FIG. 3A, a first example of a photon detection light receiving device of an optical wireless communication apparatus according to an embodiment of the present invention will be described. The photon detection light receiving device of the present example includes a photon detection APD light receiving device 140. The photon detection APD light receiving device 140 has a photon detection APD 1401, a quenching resistor 1402, and a capacitor 1403. The photon detection APD 1401 has a cathode side terminal 1405 and an anode side terminal 1406. An end of the quenching resistor 1402 is connected to a terminal 1406 on the anode side of the photon detection APD 1401. An end of the capacitor 1403 is connected to a terminal 1406 on the anode side of the photon detection APD 1401. That is, an end of the quenching resistor 1402 and an end of the capacitor 1403 are connected to a photon detection APD 1401. A signal output terminal 1408 is provided at the other end of the capacitor 1403. A feature of the photon detection APD light receiving device 140 of this example is to provide a capacitor 1403. The function of the capacitor 1403 will be described in detail later.

A DC power supply 1404 is connected between a cathode side terminal 1405 of the photon detection APD 1401 and the other terminal 1407 of the quenching resistor 1402. The reverse bias voltage applied to the photon detection APD 1401 is a value obtained by subtracting the voltage drop amount due to the quenching resistor 1402 from the voltage "V" of the DC power supply 1404.

The voltage applied to the photon detection APD 1401 of the photon detection APD light receiving device 140 of this example will be described. In general, the APD has a linear mode for operating with a reverse bias voltage lower than a yield voltage (breakdown voltage) and a Geiger mode for operating with a reverse bias voltage higher than the breakdown voltage. In the Geiger mode, a single-photon avalanche breakdown can occur.

In FIG. 3A, the photon detection APD light receiving device 140 of the present example is operated in a linear mode. The reverse bias voltage applied to the photon detection APD 1401 is lower than the breakdown voltage. When the photon detection APD light receiving device 140 of this example is operated in a linear mode, single-photon avalanche breakdown can occur.

In FIG. 3A, when a reverse bias voltage is applied to the photon detection APD 1401, it becomes such a condition that the free carrier is activated in the photon detection APD 1401. When the received light 141 is radiated on the photon detection APD 1401, a single-photon avalanche breakdown occurs. A multiplied current "i" flows from a terminal 1405 on the cathode side of the photon detection APD 1401 to a terminal 1406 on the anode side. The quenching resistor 1402 has a function of preventing a large current from flowing to the photon detection APD 1401. The current "i" includes a DC component and an AC component. The DC component is consumed by the quenching resistor 1402, and the AC component flows through the capacitor 1403 and can be taken out from the signal output terminal 1408. The AC component of the current "i" corresponds to the acceleration fluctuation of the photon radiated on the photon detection APD 1401, and the reception data included in the received light 141 can be taken out. That is, the received data can be taken out from the output current waveform via the signal output terminal 1408. The output current waveform will be described in detail later.

Figure 3B:
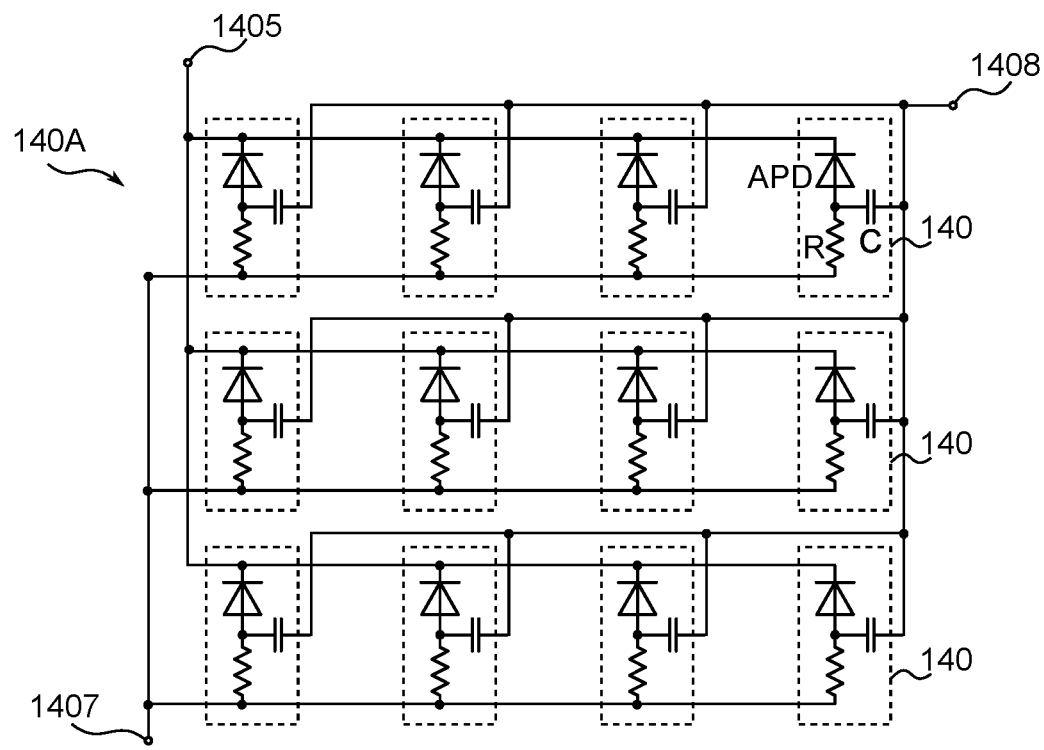
FIG. 3B is a diagram showing a second example of a photon detection light receiving device of an optical wireless communication apparatus according to an embodiment of the present invention.

Referring to FIG. 3B, a third example of a photon detection light receiving device 14 of an optical wireless communication apparatus according to an embodiment of the present invention will be described. The photon detection light receiving device of the present example includes a photon detection APD light receiving device array 140A. The photon detection APD light receiving device array 140A includes a plurality of photon detection APD light receiving devices 140, for example, 3600 pieces of photon detection APD light receiving devices 140. The configuration of the photon detection APD light receiving device 140 has been described with reference to FIG. 3A. A cathode side terminal and an anode side terminal of the photon detection APD of each photon detection APD light receiving device 140 are respectively connected to terminals 1405 and 1407 of a photon detection APD light receiving device array 140A. A signal output terminal of a capacitor of each photon detection APD light receiving device 140 is connected to a signal output terminal 1408 of a photon detection APD light receiving device array 140A. In this example, the same reverse bias voltage is applied to the photon detection APD in all the photon detection APD light receiving devices 140. The sum of output currents from signal output terminals 1408 of capacitors 1403 of all the photon detection APD light receiving devices 140 is taken out from a signal output terminal 1408.

Figure 4A:
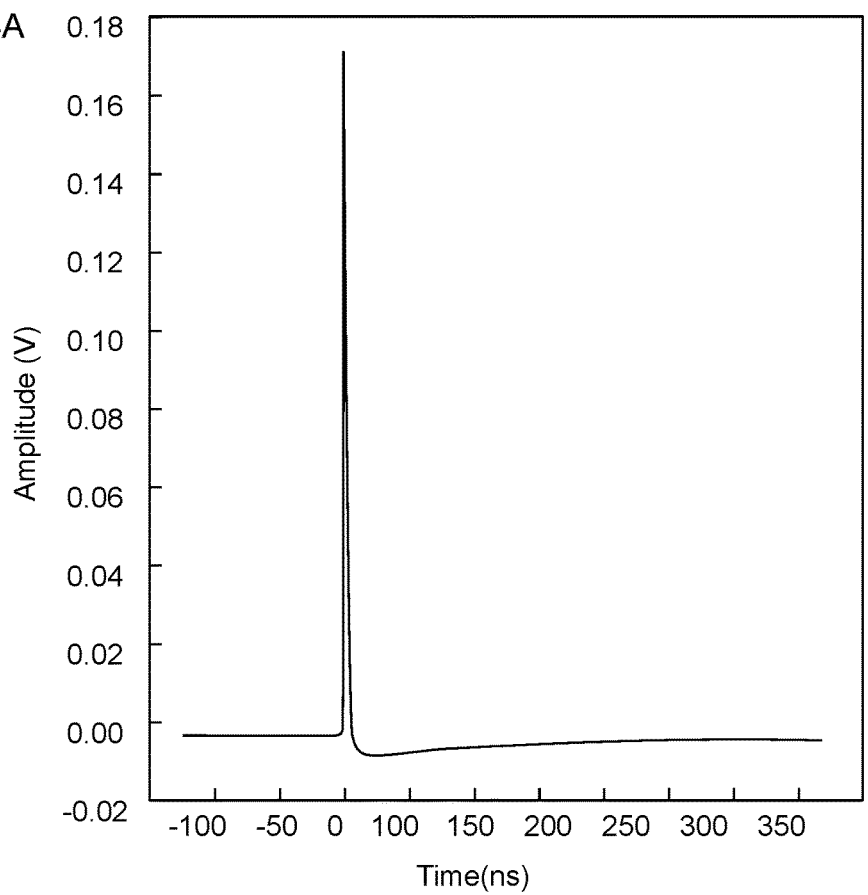
FIG. 4A is a diagram illustrating an experimental result of an output voltage waveform in a linear mode of a photon detection APD performed by inventors of the present application.

Referring to FIG. 4A, an experiment of an output voltage waveform in a linear mode of a photon detection APD performed by inventors of the present application and a result thereof will be described. In this experiment, a photon detection APD light receiving device array 140A shown in FIG. 3B is used. The photon detection APD light receiving device array 140A includes 3600 pieces of photon detection APD light receiving devices 140. The capacitance "C" of the capacitor 1403 of each photon detection APD light receiving device 140 is set to 0.1-5 pF, the resistance value "R" of the quenching resistor 1402 is set to several hundred Ω, and the peak of the wavelength of the received light 141 of the photon detection APD 1401 is set to 405-470 nm. In this experiment, a photon detection APD light receiving device array 140A is operated in a linear mode. That is, a reverse bias voltage lower than a breakdown voltage is applied to a photon detection APD 1401 of each photon detection APD light receiving device 140 to cause single-photon avalanche breakdown.

The horizontal axis of the graph of FIG. 4A is time (unit: ns), and the vertical axis is a voltage waveform (unit: V) showing single-photon avalanche breakdown. The voltage waveform is measured by a voltmeter based on a current obtained from a signal output terminal 1408 of a photon detection APD light receiving device array 140A. As shown, the width of the lower end of the waveform of the single-photon avalanche voltage pulse is referred to as a dead time. That is, the time from the rise of the output voltage pulse to zero is referred to as the dead time. In this experiment, the dead time is 1.3 ns and the peak voltage is 0.17 V. The time constant can be reduced by sufficiently reducing the capacity "C" of the capacitor 1403. The dead time represents the communication delay of the optical wireless communication apparatus using the receiving device.

In a photon detection light receiving device according to an embodiment of the present invention, the capacitance "C" of the capacitor 1403 is 0.1-5 pF, preferably 0.5-3 pF. The resistance value "R" of the quenching resistor 1402 is 10-1000Ω, preferably 10-500Ω. A photon detection light receiving device according to an embodiment of the present invention is operated in a linear mode. Here, the linear mode is an operating state with an applied voltage of 70 V or less. The applied voltage of the photon detection APD 1401 of this example is several to 70 V, preferably 10-70 V, and more preferably 30-70 V. The received light 141 of the photon detection APD 1401 can be near-ultraviolet light, visible light, near-infrared light, or infrared light, but is preferably blue-violet visible light having a peak at a wavelength of 405-470 nm. The dead time of the photon detection APD 1401 is 500 ps to 5 ns, and the peak voltage of the avalanche voltage waveform is 0.1-0.5 V.

Figure 4B:
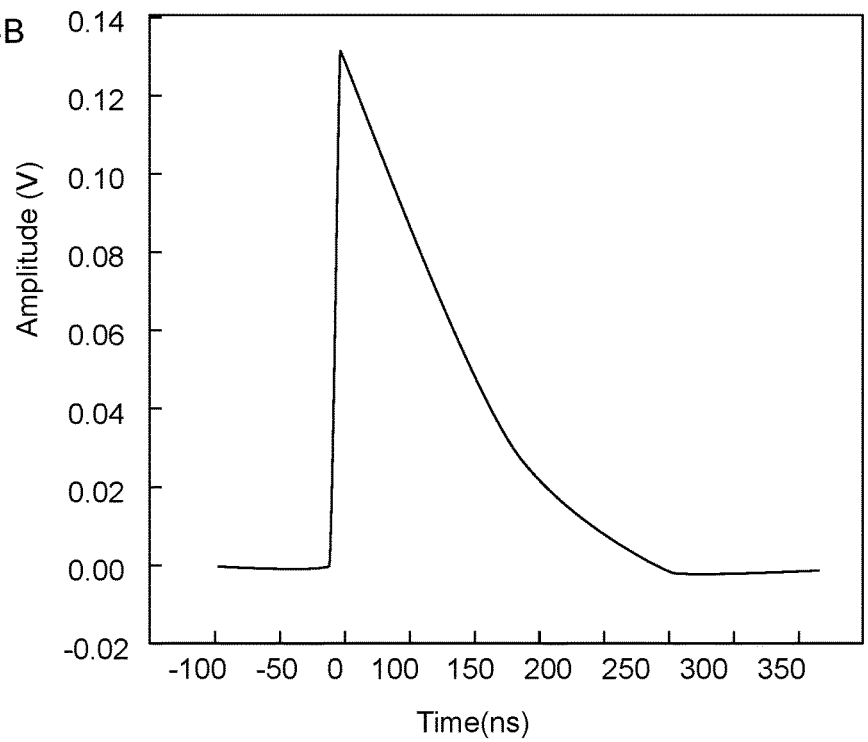
FIG. 4B is a diagram showing an example of an output voltage waveform of an APD in a Geiger mode in a conventional light receiving device.

FIG. 4B shows an example of an output voltage waveform of an APD in a conventional light receiving device. The horizontal axis of the graph of FIG. 4B is time (unit: ns), and the vertical axis is a voltage waveform (unit: V) showing avalanche breakdown. In a conventional light receiving device, a capacitor 1403 (FIG. 3A) is not provided. That is, the conventional light receiving device is composed of an APD and a quenching resistor and is operated in a Geiger mode. As shown in the drawing, the dead time is 250 ns and the peak voltage is 0.13 V.

A photon detection light receiving device according to an embodiment of the present invention is operated in a linear mode. That is, a reverse bias voltage smaller than a breakdown voltage is applied to the photon detection APD light receiving device 140. Therefore, a failure is not generated due to high voltage application unlike a conventional APD. In the photon detection light receiving device according to an embodiment of the present invention, the dead time is 5 ns or less. Therefore, the delay of the communication time in the mesh type network communication can be shortened when the optical wireless communication apparatus provided with the photon detection light receiving device of the embodiment according to the present invention is used.

Figure 5A:
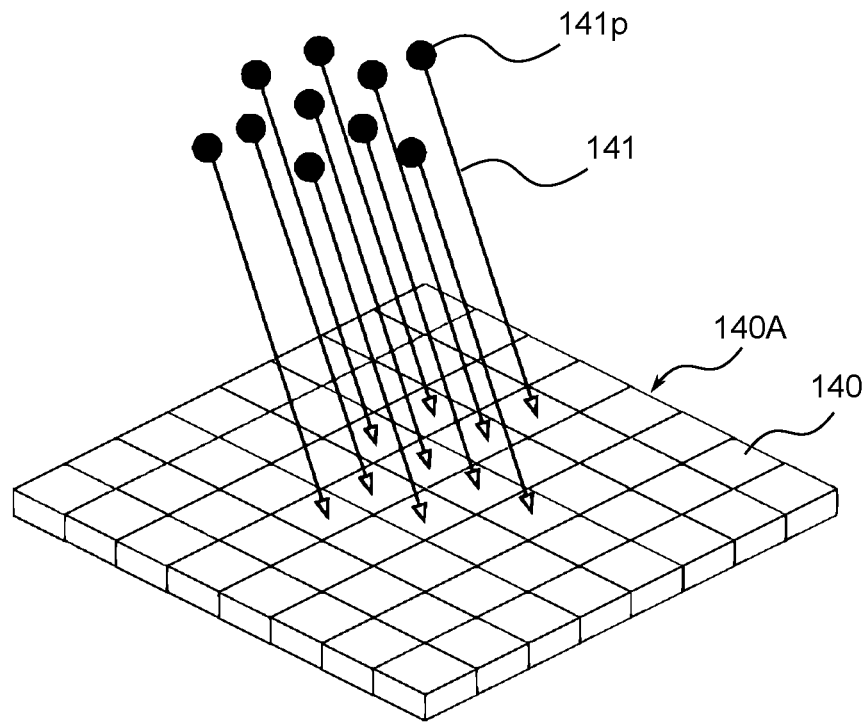
FIG. 5A is a first diagram illustrating a single-photon avalanche breakdown of a photon detection light receiving device of an optical wireless communication apparatus according to an embodiment of the present invention.
Figure 5B:
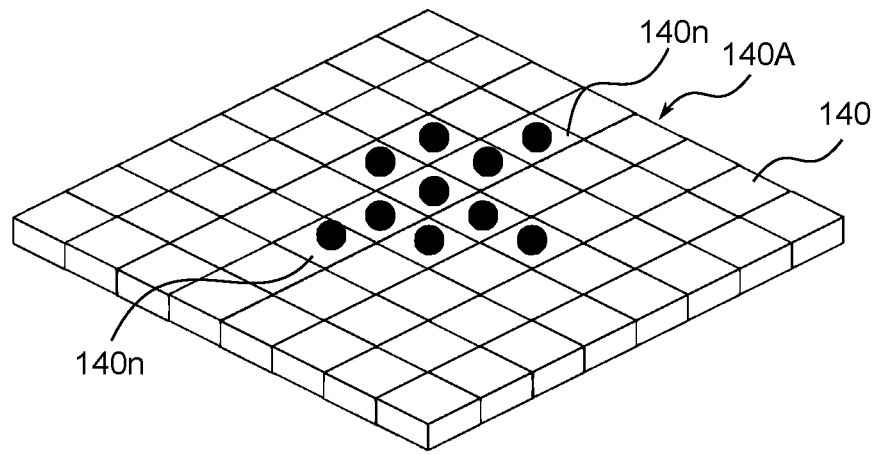
FIG. 5B is a second diagram illustrating a single-photon avalanche breakdown of a photon detection light receiving device of an optical wireless communication apparatus according to an embodiment of the present invention.
Figure 5C:
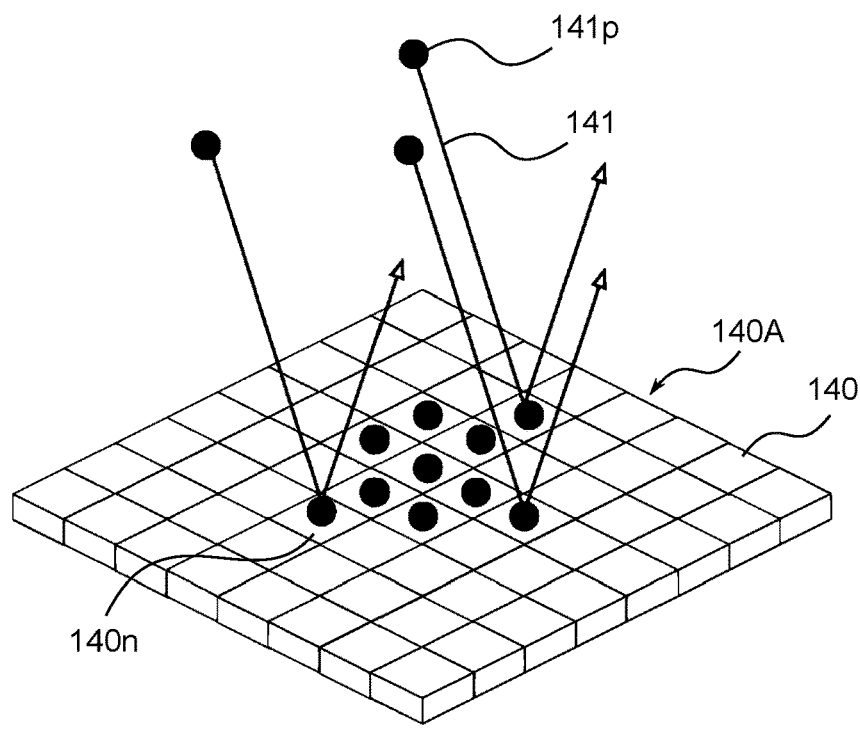
FIG. 5C is a third diagram illustrating a single-photon avalanche breakdown of a photon detection light receiving device of an optical wireless communication apparatus according to an embodiment of the present invention.

Referring to FIGS. 5A, 5B, and 5C, a single-photon avalanche breakdown will be described. FIG. 5A shows an example of a photon detection APD light receiving device array 140A according to the embodiment of FIG. 3B. The photon detection APD light receiving device array 140A includes a plurality of photon detection APD light receiving devices 140. Light has two properties of waves and particles. As shown in FIG. 5A, when the received light 141 is received, it can be received as a single-photon 141*p*. For example, when the received light 141 is blue light having a wavelength of 470 nm, the energy of the single-photon 141*p* is 2. 6 eV. FIG. 5B shows a state in which single-photon avalanche breakdown occurs by a single-photon 141*p* in a photon detection APD light receiving device 140*n*. As shown in FIG. 5C, the photon detection APD light receiving device 140*n* in which a single-photon avalanche breakdown occurred does not cause further single-photon avalanche breakdown before the output current becomes zero. That is, within the dead time, the next single-photon avalanche breakdown does not occur.

Figure 6A:
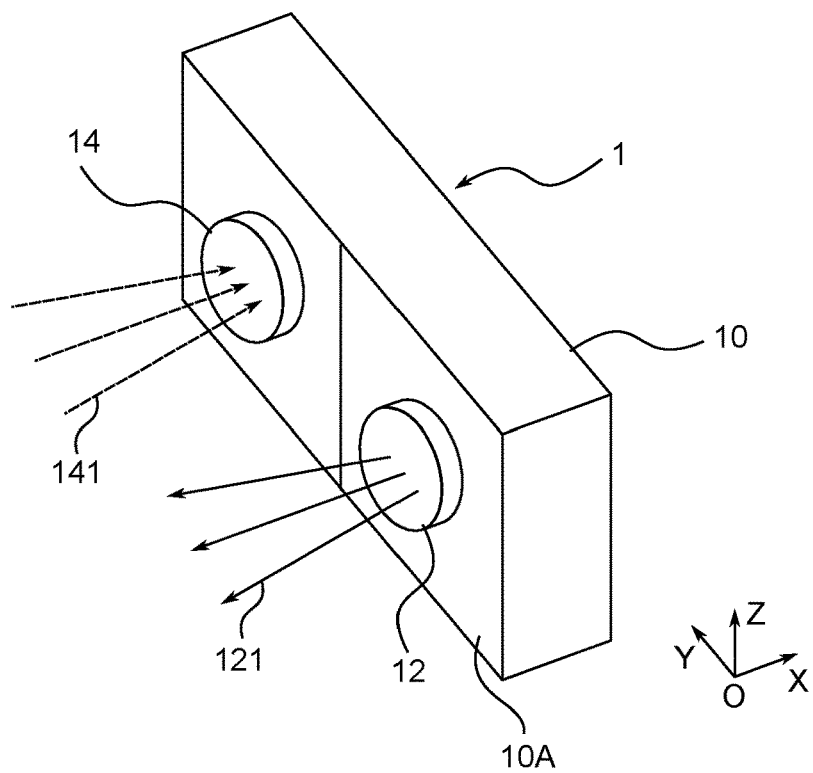
FIG. 6A is a diagram illustrating a first example of an optical wireless communication apparatus according to an embodiment of the present invention.

Referring to FIG. 6A, an example of an optical wireless communication apparatus 1 according to an embodiment of the present invention will be described. The optical wireless communication apparatus 1 according to this example has a housing 10, a light emitting device 12 and a photon detection light receiving device 14, disposed on the front surface 10A of the housing. As shown in FIG. 6A, XYZ axes are set in a space. The Z-axis is set along the vertical direction upwardly, and the X-axis and the Y-axis are set on the horizontal plane. In this example, the optical wireless communication apparatus 1 is disposed such that the front surface 10A of the housing is disposed along the vertical surface. The transmission light 121 from the light emitting device 12 is indicated by a solid line arrow, and the received light 141 received by the photon detection light receiving device 14 is indicated by a broken line arrow.

Figure 6B:
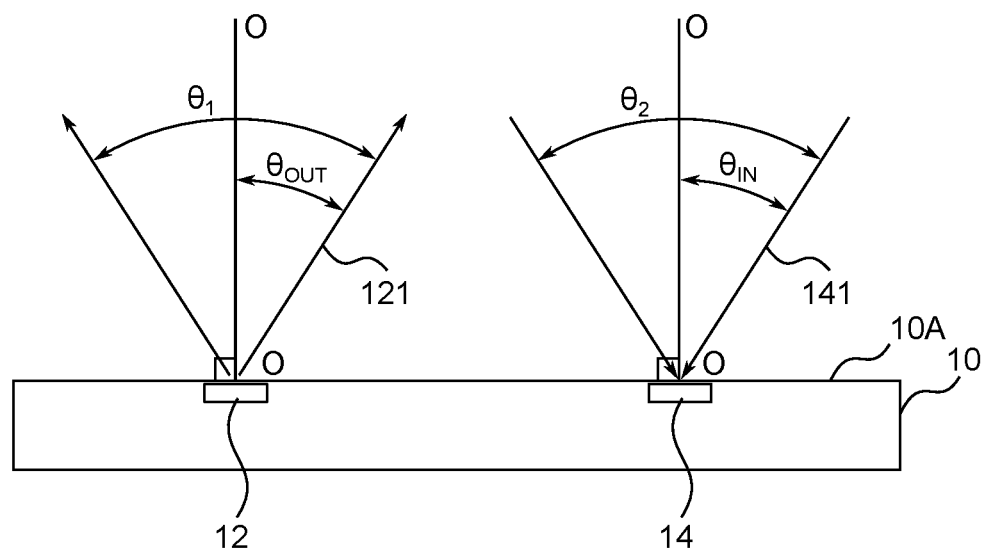
FIG. 6B is a diagram illustrating an exit angle of transmission light and an incident angle of received light in an optical wireless communication apparatus according to an embodiment of the present invention.

Referring to FIG. 6B, an exit angle of the transmission light 121 from the light emitting device 12 and an incident angle (θ) of the received light 141 in the photon detection light receiving device 14 will be described. The exit angle and the incident angle are represented generally by a three-dimensional angle, but here are simplified and considered on a two-dimensional plane. A vertical line O-O is set up on the front surface 10A of the housing 10 of the optical wireless communication apparatus 1. The inclination angle of the transmission light 121 to the vertical line O-O is set as $\theta_{OUT}$, and the inclination angle of the received light 141 to the vertical line O-O is set as $\theta_{IN}$. For example, when an LED is used as a light source, the light intensity becomes maximum in a direction along the optical axis, and becomes smaller as the inclination angle increases with respect to the optical axis. That is, the light intensity of the transmission light 121 becomes maximum when the inclination angle $\theta_{OUT}$ is zero and becomes smaller as the inclination angle $\theta_{OUT}$ increases.

Therefore, a range of angle where the light intensity of the transmission light 121 is larger than a predetermined value is referred to as irradiation angle $\theta_{OUT}$, and its double is referred to as a spread angle $\theta_1$. The received light 141 is also the same. A range of angle where the light intensity of the received light 141 is larger than a predetermined value is defined as a light receiving angle $\theta_{IN}$, and its double is referred to as a spread angle $\theta_2$. Hereinafter, the transmission light 121 and the received light 141 are used as the meaning of a luminous flux having a light intensity greater than a predetermined light intensity.

Figure 7A:
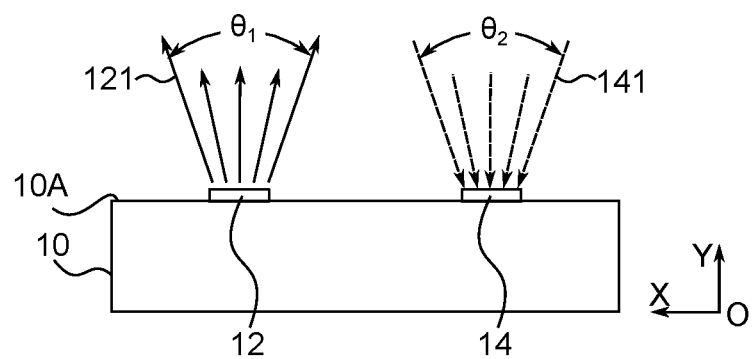
FIG. 7A is a diagram illustrating a spread angle (θ) of transmission light from a light emitting device and a spread angle (θ) of received light by the photon detection light receiving device in a first example of an optical wireless communication apparatus according to an embodiment of the present invention.
Figure 7B:
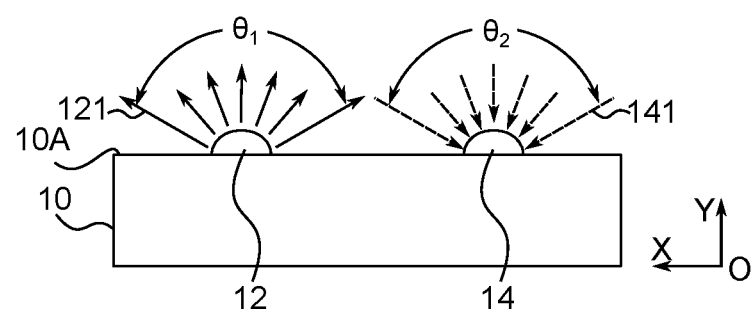
FIG. 7B is a diagram illustrating a spread angle (θ) of transmission light from a light emitting device and a spread angle (θ) of received light by the photon detection light receiving device in a second example of an optical wireless communication apparatus according to an embodiment of the present invention.
Figure 7C:
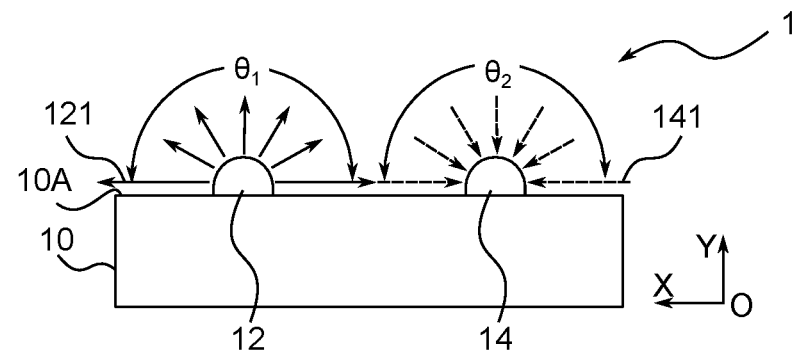
FIG. 7C is a diagram illustrating a spread angle (θ) of transmission light from a light emitting device and a spread angle (θ) of received light by the photon detection light receiving device in a third example of an optical wireless communication apparatus according to an embodiment of the present invention.

Referring to FIGS. 7A, 7B, and 7C, the spread angle $\theta_1$ of the transmission light 121 from the light emitting device 12 and the spread angle $\theta_2$ of the received light 141 by the photon detection light receiving device 14 in the first, second, and third examples of the optical wireless communication apparatus of the embodiment of the present invention will be described. In the optical wireless communication apparatus shown in FIG. 7A, the spread angle $\theta_1$ of the transmission light 121 and the spread angle $\theta_2$ of the received light 141 are relatively small, for example, 30-90 degrees, respectively. In the optical wireless communication apparatus shown in FIG. 7B, the spread angle $\theta_1$ of the transmission light 121 and the spread angle $\theta_2$ of the received light 141 are relatively large and 90-120 degrees, respectively. In the optical wireless communication apparatus shown in FIG. 7C, the spread angle $\theta_1$ of the transmission light 121 and the spread angle $\theta_2$ of the received light 141 are sufficiently large and 120-180 degrees, respectively.

Figure 8A:
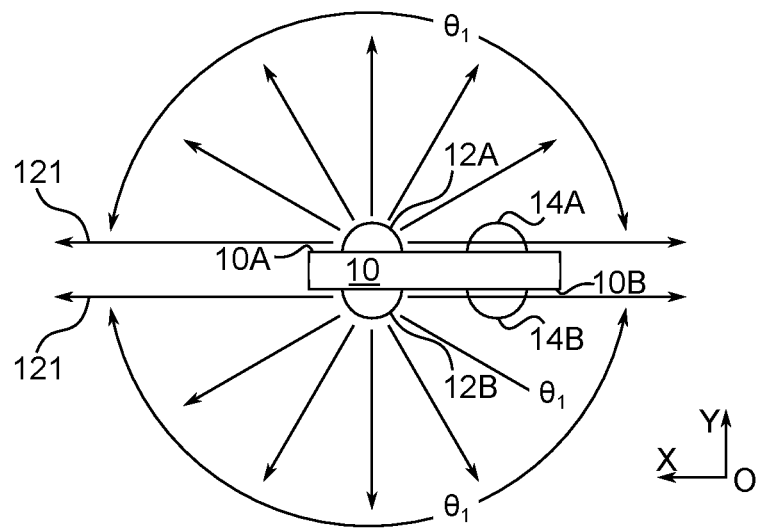
FIG. 8A is a diagram illustrating a fourth example of an optical wireless communication apparatus according to an embodiment of the present invention.

Referring to FIG. 8A, a fourth example of an optical wireless communication apparatus according to an embodiment of the present invention will be described. The optical wireless communication apparatus 1 according to this example has a housing 10, light emitting devices 12A, 12B and photon detection light receiving devices 14A, 14B, disposed on two surfaces 10A, 10B of the housing, respectively. The optical wireless communication apparatus 1 according to this example is integrally configured by a box-shaped housing 10. As shown, XYZ axes are set in a space. The Z-axis is set along the vertical direction upwardly, and the X-axis and the Y-axis are set on the horizontal plane. In this example, the optical wireless communication apparatus 1 is disposed such that two surfaces 10A, 10B of the housing are vertically disposed. The transmission light 121 from the light emitting devices 12A and 12B is indicated by a solid line arrow. The spread angle $\theta_1$ of the transmission light 121 is sufficiently large and 180 degrees. Since the optical wireless communication apparatus 1 according to this example has two light emitting devices 12A, 12B, the sum of the spread angles $\theta_1$ of the transmission lights 121 of the two light emitting devices 12A, 12B is 360 degrees. The illustration of the received light received by the photon detection light receiving device 14 is omitted. The spread angle $\theta_2$ of the received light 141 is sufficiently large and 180 degrees similarly. Since the optical wireless communication apparatus 1 according to this example has two photon detection light receiving devices 14A, 14B, the sum of the spread angles $\theta_2$ of the received lights 141 is 360 degrees.

Figure 8B:
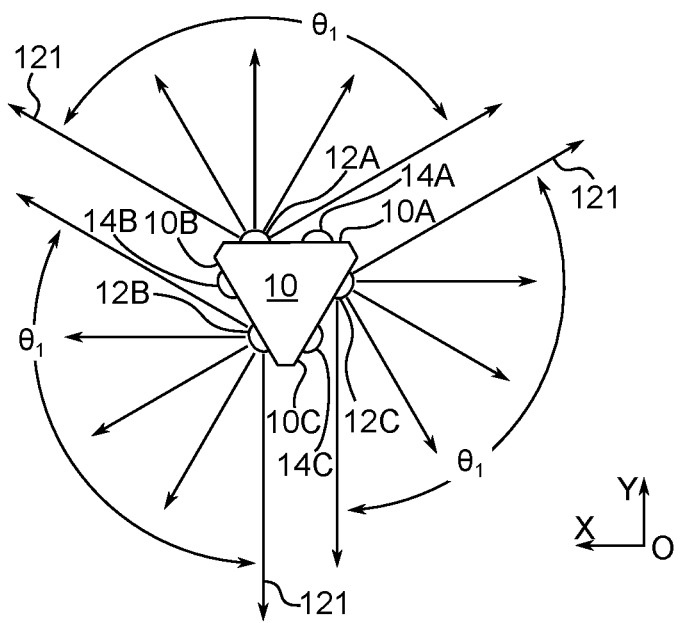
FIG. 8B is a diagram illustrating a fifth example of an optical wireless communication apparatus according to an embodiment of the present invention.

Referring to FIG. 8B, a fifth example of an optical wireless communication apparatus according to an embodiment of the present invention will be described. The optical wireless communication apparatus 1 according to this example has a housing 10, light emitting devices 12A, 12B, 12C and photon detection light receiving devices 14A, 14B, 14C, disposed on three surfaces 10A, 10B, 10C of the housing, respectively. The optical wireless communication apparatus 1 according to this example is integrally configured by a triangular prism-shaped housing 10. As shown, XYZ axes are set in a space. The Z-axis is set along the vertical direction upwardly, and the X-axis and the Y-axis are set on the horizontal plane. In this example, the optical wireless communication apparatus 1 is disposed such that the three surfaces 10A, 10B, 10C of the housing are vertically disposed. The transmission lights 121 from the light emitting devices 12A, 12B, 12C are indicated by a solid line arrow. The spread angle $\theta_1$ of the transmission light 121 is sufficiently large and 120 degrees. Since the optical wireless communication apparatus 1 according to this example is provided with three light emitting devices 12A, 12B, 12C, the sum of spread angles $\theta_1$ of all the transmission lights 121 is 360 degrees. The illustration of the received light received by the photon detection light receiving device 14 is omitted. The spread angle $\theta_2$ of the received light 141 is sufficiently large and 120 degrees. Since the optical wireless communication apparatus 1 according to this example is provided with three photon detection light receiving devices 14A, 14B, 14C, the sum of spread angles $\theta_2$ of all the received lights 141 is 360 degrees.

Figure 9A:
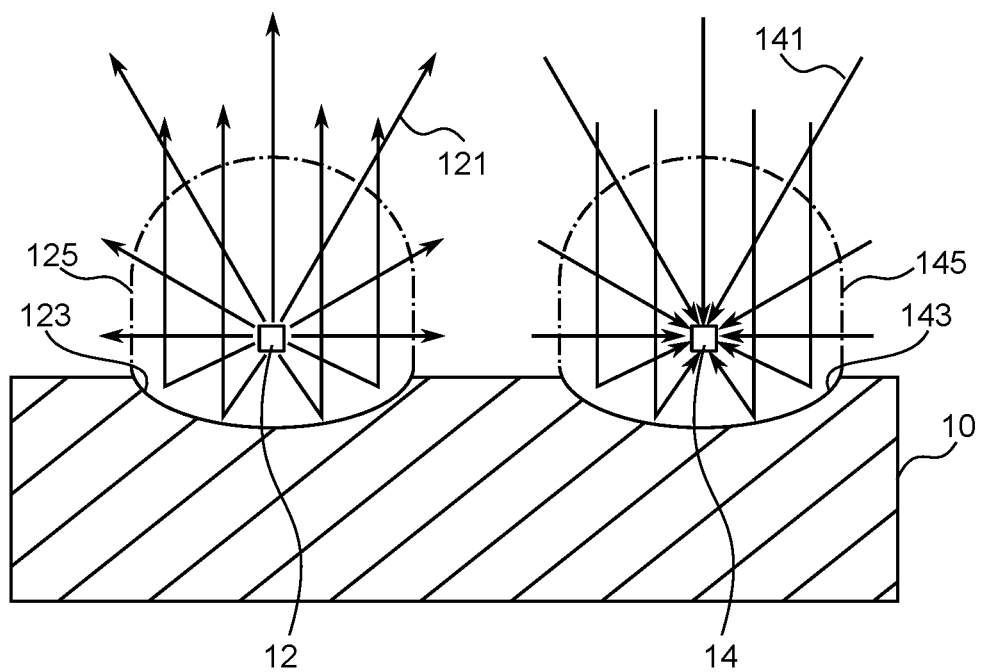
FIG. 9A is a diagram illustrating a sixth example of an optical wireless communication apparatus according to an embodiment of the present invention.

Referring to FIG. 9A, a sixth example of an optical wireless communication apparatus according to an embodiment of the present invention will be described. The optical wireless communication apparatus 1 according to this example has a housing 10, a light emitting device 12 and a photon detection light receiving device 14, disposed on the front surface 10A of the housing, respectively. Reflective surfaces 123, 143 and light diffusion media 125, 145 are provided on the front surface 10A of the housing. The light emitting device 12 is disposed at a focal position of the reflective surface 123 and is covered by the light diffusion medium 125. The photon detection light receiving device 14 is disposed at a focal position of the reflection surface 143 and is covered by the light diffusion medium 145. The light diffusion media 125, 145 are formed of transparent resin or glass.

According to the optical wireless communication apparatus of the present example, the transmission light 121 from the light emitting device 12 is radiated over a wide angle of 360 degrees in the space before the front surface 10A of the housing. According to the optical wireless communication apparatus of the present example, the photon detection light receiving device 14 can receive the received light 141 incident over a wide angle of 360 degrees from almost all over the space before the front surface 10A of the housing.

Figure 9B:
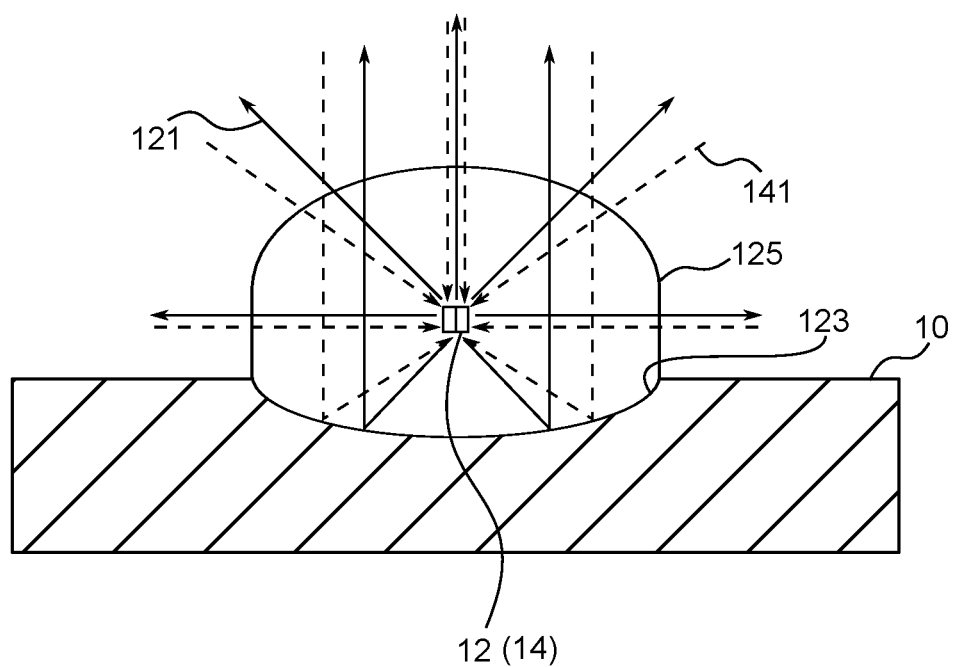
FIG. 9B is a diagram illustrating a seventh example of an optical wireless communication apparatus according to an embodiment of the present invention.

Referring to FIG. 9B, a seventh example of an optical wireless communication apparatus according to an embodiment of the present invention will be described. The optical wireless communication apparatus 1 according to this example has a housing 10, a light emitting device 12 and a photon detection light receiving device 14, disposed on the front surface 10A of the housing, respectively. The light emitting device 12 and the photon detection light receiving device 14 are disposed adjacently or formed integrally. A reflecting surface 123 and a light diffusion medium 125 are provided on the front surface 10A of the housing. The light emitting device 12 and the photon detection light receiving device 14 are disposed at a focal position of the reflecting surface 123 and covered with the light diffusion medium 125. The light diffusion medium 125 may be configured such that light diffusion particles such as titanium oxide particles or core-shell particles are dispersedly included in a transparent base material such as resin or glass.

Figure 10:
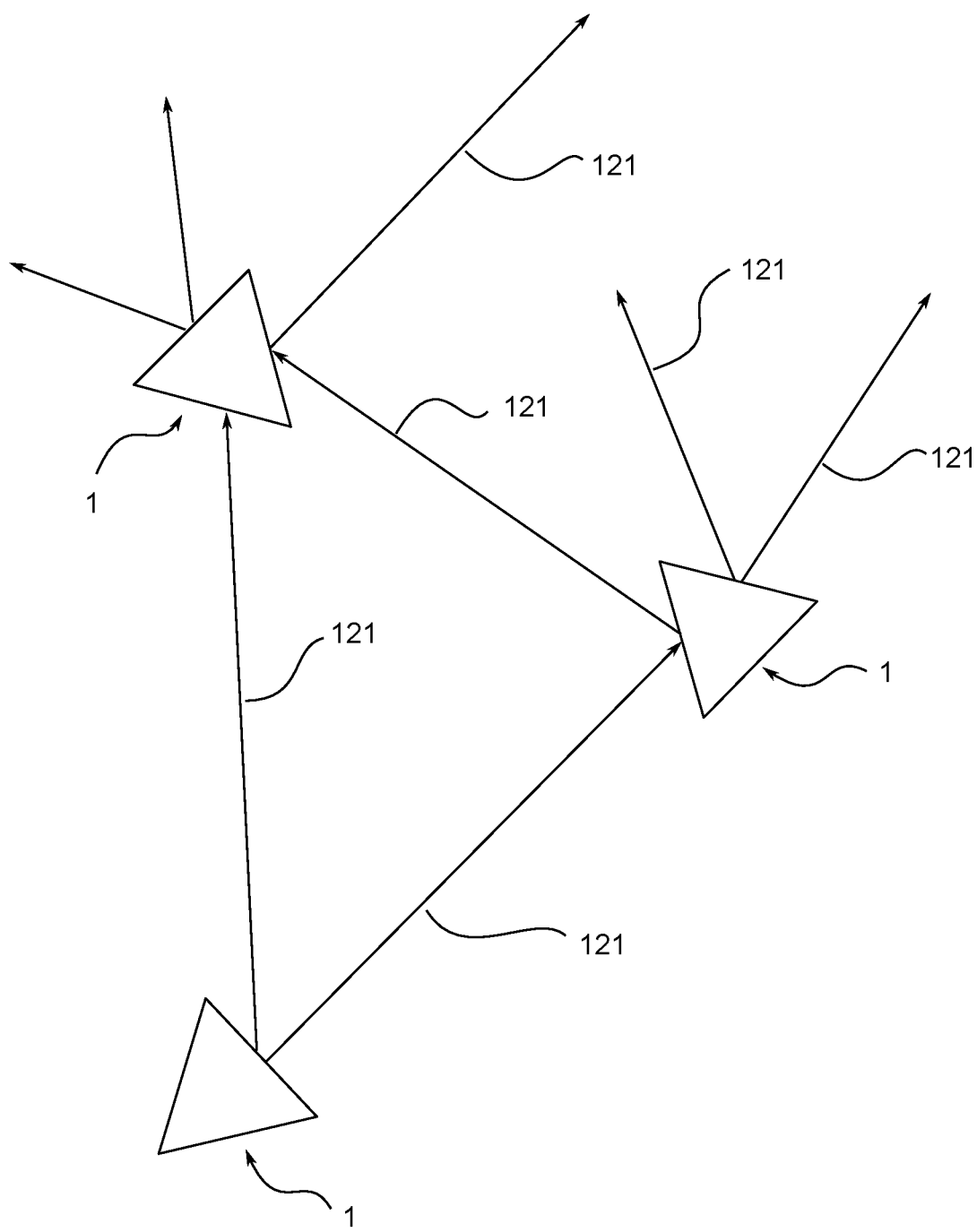
FIG. 10 is a diagram illustrating an example of a configuration of an optical wireless communication network including an optical wireless communication apparatus according to an embodiment of the present invention.

Referring to FIG. 10, an example of a configuration of an optical wireless communication network including an optical wireless communication apparatus according to an embodiment of the present invention will be described. An example shown in FIG. 8B is used as the optical wireless communication apparatus 1. The optical wireless communication apparatus 1 has a housing having three surfaces. In each of the three surfaces, a light emitting device and a photon detection light receiving device are disposed, and the illustration thereof being omitted, only transmission light 121 from the light emitting device is shown. According to this example, since the optical wireless communication apparatus 1 has a light emitting device and a photon detection light receiving device disposed on three surfaces, respectively, even when an obstacle exists in the communication space, or even when an obstacle is unexpectedly generated, an optical wireless communication network can be configured.

The optical wireless communication apparatus according to this example is provided with a high-sensitivity photon detection light receiving device 14. Therefore, even if the transmission light 121 from the light emitting device 12 is radiated over a wide angle in the space, the photon detection light receiving device 14 can sufficiently receive the received light 141. The optical wireless communication apparatus according to this example may be configured such that the transmission light 121 from the light emitting device is radiated at a narrow angle. That is, the optical wireless communication apparatus may use a light emitting device that emits beam-like light such as a laser diode. In this case, tracking for alignment between the transmitting side and the receiving side is required.

In mesh type network communication, a communication speed of an optical wireless communication apparatus using a photon detection light receiving device of an embodiment of the present invention and a communication speed of a communication apparatus using a conventional light receiving device are compared. For example, in mesh type network communication, N pieces of communication apparatus are relayed and data is transmitted. A dead time of a photon detection light receiving device according to an embodiment of the present invention is set to 5 ns, and a dead time of a conventional light receiving device is set to 250 ns. The delay of communication in the case of using the optical wireless communication apparatus according to the present embodiment is 5×N ns. A delay in the case of using a communication apparatus using a conventional light receiving device is 250×N ns. Therefore, in the embodiment of the present invention, the delay of communication time in the mesh type network communication can be sufficiently reduced.

Although the photon detection light receiving devices according to the present embodiment and the optical wireless communication apparatus using the same have been described, these are exemplary and are not intended to limit the scope of the embodiment of the present invention. Any addition, deletion, change, improvement or the like to the present embodiments which a person skilled in the art could easily perform is within the scope of an embodiments of the present invention. The technical scope of an embodiment of the present invention is defined by the appended claims.

EXPLANATION OF REFERENCES

1_Optical wireless communication apparatus, 5_Light receiving/emitting portion, 10_Housing, 10A, 10B and 10C_Surface, 12, 12A, 12B and 12C_Light emitting device, 14, 14A, 14B, 14C_Photon detection light receiving device, 16_Light emitting device control circuit, 18_Light receiving device control circuit, 20_Optical wireless communication controller, 22_Interface portion, 30_Optical wireless communication connection portion, 31A and 31B_Coaxial cable, 32_TX terminal, 33_RX terminal, 35_O/E conversion circuit, 36_E/O conversion circuit, 37A, 37B_Optical fiber cable, 38_E/O conversion circuit, 39_O/E conversion circuit, 121_Transmission light, 123_Reflective surface, 125_Light diffusion medium, 140_Photon detection APD light receiving device, 140A_Photon detection APD light receiving device array, 141_Received light, 141p_Photon, 143_Reflective surface, 145_Light diffusion medium, 201_RF conversion circuit, 202_D/A circuit, 203_Modulation circuit, 211_RF amplifier circuit, 212_A/D circuit, 213_Demodulation circuit, 1401_Photon detection avalanche photodiode (APD), 1402_Quenching resistor, 1403_Capacitor, 1404_DC power supply, 1405_Terminal, 1406_Terminal, 1407_Terminal, 1408_Terminal,

The invention claimed is:

1. A photon detection light receiving device comprising:
a photon detection avalanche photodiode (APD), a quenching resistor and a capacitor,
wherein an end of the quenching resistor and an end of the capacitor are connected to one of terminals of the photon detection APD, a signal output terminal through which output current can be taken out being connected to the other end of the capacitor, and the photon detection APD is operated in a linear mode in which a reverse bias voltage lower than a breakdown voltage is applied,
wherein the reverse bias voltage is 10-70 V, a resistance value "R" of the quenching resistor is 10-1000Ω, and a capacitance "C" of the capacitor is 0.1-5 pF.

2. The photon detection light receiving device according to claim 1,
wherein when a peak of a wavelength of a received light of the photon detection APD is 405-470 nm, a peak voltage of a single-photon avalanche voltage waveform of the photon detection APD is 0.1-0.5 V, and a dead time of the photon detection APD is 500 ps to 5 ns.

3. A photon detection light receiving device array comprising:
a plurality of photon detection light receiving devices connected in an array,
wherein each of the photon detection light receiving devices has a photon detection APD, a quenching resistor and a capacitor, an end of the quenching resistor and an end of the capacitor being connected to one of terminals of the photon detection APD, a signal output terminal through which output current can be taken out being connected to the other end of the capacitor, and the photon detection APD is operated in a linear mode in which a reverse bias voltage lower than a breakdown voltage is applied,
wherein the reverse bias voltage is 10-70 V, a resistance value "R" of the quenching resistor is 10-1000Ω, and a capacitance "C" of the capacitor is 0.1-5 pF, and wherein when a peak of a wavelength of the received light of the photon detection APD is 405-470 nm, a peak voltage of a single-photon avalanche voltage waveform of the photon detection APD is 0.1-0.5 V, and a dead time of the photon detection APD is 500 ps to 5 ns.

4. An optical wireless communication apparatus comprising:
a housing, a photon detection light receiving device that generates an electric signal from a received light, a reception portion that generates a reception data signal from an electric signal from the photon detection light receiving device, a transmission portion that generates an electric signal from a transmission data signal, a light emitting device that receives an electric signal from the transmission portion and generates transmission light, and an optical wireless communication controller that generates reception data or transmission data corresponding to a protocol of an external apparatus,
wherein the photon detection light receiving device has a photon detection APD, a quenching resistor and a capacitor, an end of the quenching resistor and an end of the capacitor being connected to one of terminals of the photon detection APD, a signal output terminal through which output current can be taken out being connected to the other end of the capacitor, and the photon detection APD is operated in a linear mode in which a reverse bias voltage lower than a breakdown voltage is applied,
wherein the reverse bias voltage is 10-70 V, a resistance value "R" of the quenching resistor is 10-1000Ω, and a capacitance "C" of the capacitor is 0.1-5 pF,
wherein when a peak of a wavelength of the received light of the photon detection APD is 405-470 nm, a peak voltage of a single-photon avalanche voltage waveform of the photon detection APD is 0.1-0.5 V, and a dead time of the photon detection APD is 500 ps to 5 ns.

5. An optical wireless communication apparatus according to claim 4,
wherein the housing has a plurality of surfaces, and the photon detection light receiving device and the light emitting device are disposed on each of the plurality of surfaces.

6. An optical wireless communication apparatus according to claim 4,
wherein the housing has three surfaces, and the photon detection light receiving device and the light emitting device are disposed on each of the three surfaces.

7. An optical wireless communication apparatus according to claim 4,
wherein the photon detection light receiving device and the light emitting device are covered with a light diffusion medium, and the light diffusion medium includes a transparent base material and particulate light diffusion particles dispersed in the base material.

\* \* \* \* \*